(12) United States Patent
Beroz et al.

(10) Patent No.: US 7,205,659 B2
(45) Date of Patent: Apr. 17, 2007

(54) ASSEMBLIES FOR TEMPORARILY CONNECTING MICROELECTRONIC ELEMENTS FOR TESTING AND METHODS THEREFOR

(75) Inventors: Masud Beroz, Livermore, CA (US); David Light, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/777,804

(22) Filed: Feb. 12, 2004

(65) Prior Publication Data

US 2004/0159959 A1 Aug. 19, 2004

Related U.S. Application Data

(62) Division of application No. 09/802,834, filed on Mar. 9, 2001, now Pat. No. 6,794,202.

(60) Provisional application No. 60/189,705, filed on Mar. 15, 2000, provisional application No. 60/189,664, filed on Mar. 15, 2000.

(51) Int. Cl.
*H01L 23/48* (2006.01)
(52) U.S. Cl. ............... 257/737; 257/734; 257/E23.021
(58) Field of Classification Search ............... 257/777, 257/778, 779, 780, 781, 782, 783, 784, 785, 257/786

See application file for complete search history.

(56) References Cited

U.S. PATENT DOCUMENTS 4,818,728 A * 4/1989 Rai et al.
4,875,617 A 10/1989 Citowsky
5,148,265 A 9/1992 Khandros et al.
5,148,266 A 9/1992 Khandros et al.

(Continued)

FOREIGN PATENT DOCUMENTS

JP 59-143352 * 8/1984

OTHER PUBLICATIONS

"CRC Handbook of Chemistry and Physics," ed. David Lide, 2000, CRC Press, 81st edition, p. 12-197 to 12-198.*

(Continued)

*Primary Examiner*—Leonardo Andujar
*Assistant Examiner*—Kevin Quinto
(74) *Attorney, Agent, or Firm*—Lerner, David, Littenberg, Krumholz & Mentlik, LLP

(57) ABSTRACT

A microelectronic assembly includes a first microelectronic element having a contact bearing face and at least one contact accessible at the contact bearing face, and a second microelectronic element opposing the first microelectronic element, the second microelectronic element having a first surface including at least one lead extending over the first surface. The microelectronic assembly includes the first fusible material engaging the at least one contact of the first microelectronic element, and a second fusible material engaging the at least one lead, whereby one of the first and second fusible materials has a higher melting temperature and one of the first and second fusible materials has a lower melting temperature. The first and second microelectronic elements are juxtaposed with one another so that the first and second fusible materials are in substantial alignment with one another, with one of the first and second fusible materials in a liquid state and one of the first and second fusible materials in a solid state.

11 Claims, 10 Drawing Sheets

U.S. PATENT DOCUMENTS

| | | | |
|---|---|---|---|
| 5,455,390 A | 10/1995 | DiStefano et al. | |
| 5,518,964 A | 5/1996 | DiStefano et al. | |
| 5,536,973 A * | 7/1996 | Yamaji | |
| 5,629,239 A | 5/1997 | DiStefano et al. | |
| 5,659,952 A | 8/1997 | Kovac et al. | |
| 5,763,941 A | 6/1998 | Fjelstad | |
| 5,798,286 A | 8/1998 | Faraci et al. | |
| 5,821,609 A | 10/1998 | DiStefano et al. | |
| 5,830,783 A | 11/1998 | Aiello et al. | |
| 5,915,752 A | 6/1999 | DiStefano et al. | |
| 5,976,913 A | 11/1999 | Distefano | |
| 6,288,559 B1 | 9/2001 | Bernier et al. | |
| 6,342,443 B1 | 1/2002 | Tao et al. | |
| 6,362,522 B1 * | 3/2002 | Ley | |
| 6,379,982 B1 * | 4/2002 | Ahn et al. | |

OTHER PUBLICATIONS

Doame and Franzon, Multi-Chip Module Technologies and Alternatives; the Basics (eds., 1993, pp. 450-476).

Multi-Chip Module Technologies and Alternatives; the Basics (Doame and Franzon, eds., 1993, pp. 450-476).

Harper, "Electronic Packaging and Interconnection Handbook", Mcgraw-Hill, Section 5.2, 1991.

* cited by examiner

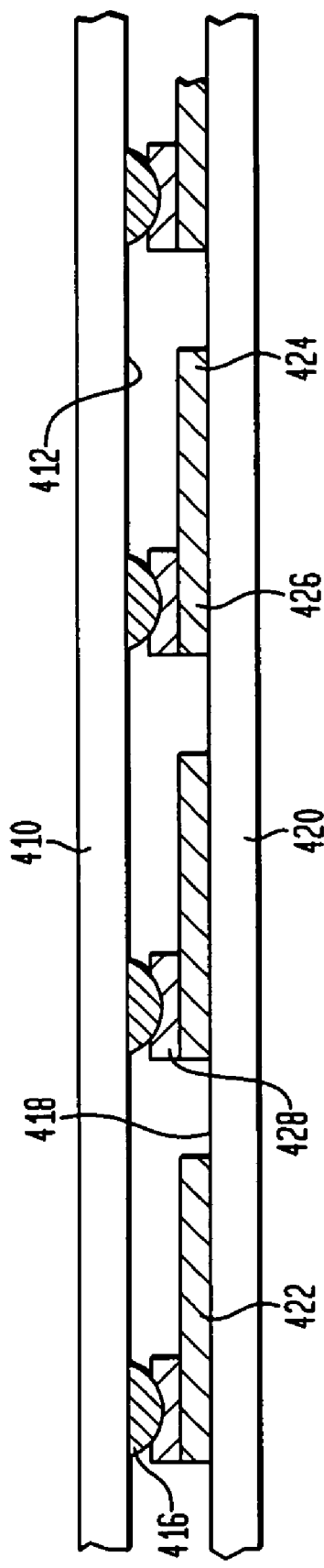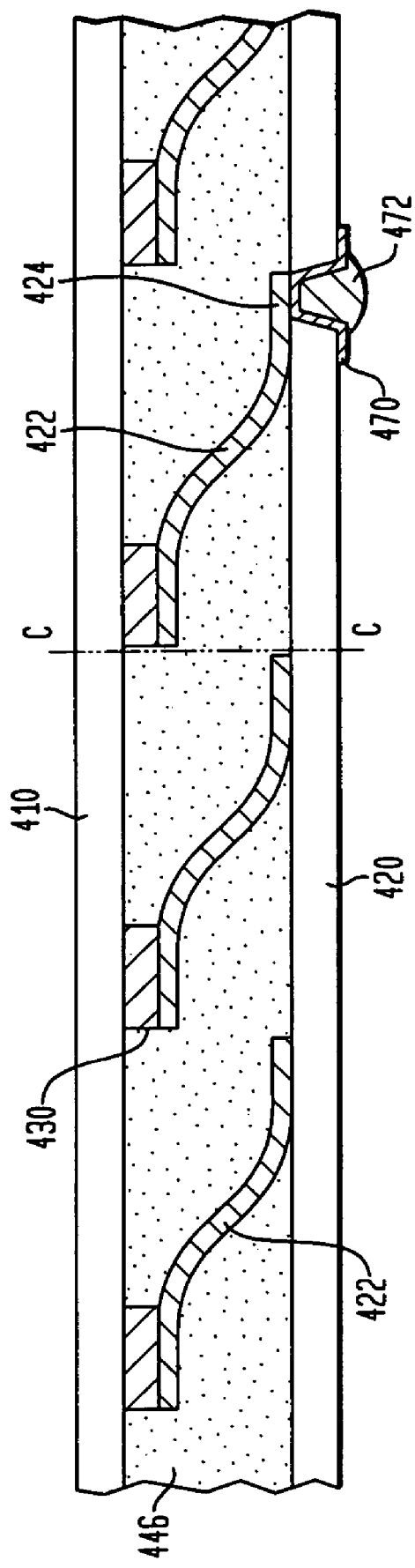

ASSEMBLIES FOR TEMPORARILY CONNECTING MICROELECTRONIC ELEMENTS FOR TESTING AND METHODS THEREFOR

CROSS REFERENCE TO RELATED APPLICATIONS

The present application is a divisional of U.S. patent application Ser. No. 09/802,834 filed Mar. 9, 2001, now U.S. Pat. No. 6,794,202 now allowed, which application claims benefit of U.S. Provisional Application No. 60/189,705, filed Mar. 15, 2000, and is related to U.S. Provisional Application No. 60/189,664, filed Mar. 15, 2000, the disclosures of which are hereby incorporated by reference herein.

FIELD OF THE INVENTION

The present invention relates to assembling microelectronic assemblies and more specifically relates to methods for temporarily connecting microelectronic elements together for testing before the elements are permanently attached to one another.

BACKGROUND OF THE INVENTION

Modern electronic devices utilize semiconductor chips, commonly referred to as "integrated circuits" which incorporate numerous electronic elements. These chips are mounted on substrates that physically support the chips and electrically interconnect each chip with other elements of the circuit. The substrate may be a part of a chip package including a single chip and equipped with terminals for interconnecting the chip with external circuit elements. The interconnection between the chip and its supporting substrate is commonly referred to as a "first level" interconnection. The interconnection between the substrate and the larger elements of the circuit is commonly referred to as a "second level" interconnection.

In a wire bonding process, the substrate has a top surface with a plurality of electrically conductive contact pads disposed on the top surface in a ring-like pattern. The chip is secured to the top surface of the substrate, at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In wire-bonded assemblies, the area of the substrate occupied by the chip, the wires and the contact pads are substantially greater than the surface area of the chip itself.

In order to save valuable space on the top surface of substrates, certain microelectronic assemblies use a die attach method commonly referred to as "flip chip" bonding. In flip-chip bonding, contacts on the front surface of the chip are provided with bump leads such as balls of solder protruding from the front surface of the chip. The chip is designed for being connected with a substrate having contact pads arranged in an array corresponding to the array of contacts on the chip. The chip is inverted so that its front surface faces toward the top surface of the substrate, with each contact and solder bump on the chip being aligned with a corresponding contact pad of the substrate. The assembly is then heated to melt the solder so as to bond each contact on the chip to a corresponding contact pad of the substrate. Flip-chip bonding is well suited for use with chips having a large number of input/output ("I/O") contacts. However, assemblies made by flip-chip bonding are quite susceptible to thermal stresses because the solder interconnections are relatively inflexible, and may be subjected to very high stress upon differential expansion of the chip and substrate. These difficulties are particularly pronounced with relatively large chips. Moreover, it is difficult to test a chip having an area array of contacts before attaching the chip to the substrate.

U.S. Pat. Nos. 5,148,265 and 5,148,266, the disclosures of which are hereby incorporated by reference herein, describe, in certain preferred embodiments, microelectronic packages having a set of pads in the form of terminals that may be mounted on a dielectric layer such as a flexible sheet. The terminals may be connected to contacts on the chip by flexible leads and may be supported above the surface of the chip by a compliant layer such as an elastomer provided between the terminals and the chip, typically between the dielectric layer and the chip. Masses of solder may be provided on the terminals for connecting the assembly to an external circuit element such as a circuit board or other substrate having corresponding contact pads.

The electrical interconnections between the conductive terminals of the chip package and the external circuit element are typically made by using fusible conductive elements, such as solder balls. The solder balls are positioned between the conductive terminals on the chip package and the contact pads on the external circuit element and then reflowed by raising the temperature of the solder balls above a predetermined temperature, generally referred to as the melting point of the solder balls. The melting point is defined as the temperature at which the solder balls transform from a first solid or frozen condition to a second molten or at least partially liquid condition. Once the solder balls have transformed to the second at least partially liquid condition, the solder balls remain in that condition as long as the temperature is maintained at or above the melting point. As described, for example, in *Multi-Chip Module Technologies And Alternatives: The Basics*, Doane and Franzon, Editors (1993), pp. 468–471, surface tension in the molten solder tends to urge each solder mass into a generally barrel-shaped object having neck portions at the junctures between the solder masses and the contact pads on the opposing microelectronic elements. After the conductive terminals of the chip package and the contact pads of the external circuit element have been electrically interconnected by the reflowed solder balls, the temperature of the solder balls may be reduced to a level below the melting point, whereupon the solder balls transform from the second at least partially liquid condition to the first solid condition. The refrozen solder balls both mechanically and electrically interconnect the chip contacts with the contact pads on the external circuit element.

Methods for electrically connecting contacts of one microelectronic element to the conductive features of another microelectronic element are disclosed in certain embodiments of U.S. Pat. No. 5,518,964, the disclosure of which is hereby incorporated by reference herein. In certain embodiments of U.S. Pat. No. 5,518,964, a component has individual chip regions. A wafer, having a number of semiconductor chips, is assembled with the component so that each chip is connected to a chip region. Features of the chips are bonded to features of the chip regions. In certain embodiments, conductive features of the component receive an electrically conductive bonding material that is applied in spots on the conductive features. The spots of electrically conductive bonding material are applied by coating a resist layer over the conductive features and photolithographically patterning the resist to form openings in the resist at the desired locations for the spots of bonding material. The electrically conductive bonding material is applied in each opening in the resist by electroplating. The conductive features are joined with contacts of the semiconductor chips in certain embodiments, using the spots of bonding material.

U.S. Pat. No. 4,875,617 discloses a method of providing gold-tin eutectic bumps on an integrated circuit wafer or on the tape or other substrate carrier. The quantity of tin reacting with gold in the method is limited and controlled, allowing gold consumption to be reduced by an order of magnitude. A first layer of gold is provided on bonding pads of the wafer after formation of the integrated circuits and a layer of tin is formed on the first gold layer. The first gold and tin layers are then thermally treated at a temperature above 280° C. to form gold-tin eutectic bumps on the first gold layer. A second gold layer is then provided as spots on a tape or other substrate carrier. The second gold layer has a thickness of about 5 percent of the gold rich eutectic body. After dicing the wafer into individual integrated circuit chips, the eutectic body on the chip's pads is placed on and bonded to the second gold layer by heating to a temperature greater than the temperature of the previous thermal treatment and leaving unalloyed gold in the first and second gold layers. The eutectic bumps can alternatively be made on the tape, with a thin gold layer on the wafer. The eutectic bumps can also be deposited directly as the gold-tin eutectic.

Despite a broad range of quality control efforts undertaken when manufacturing semiconductor chips, some chips will be defective. Unfortunately, these defects often cannot be detected until after the chip has been permanently attached to a substrate. A single bad chip can make a large assembly having numerous chips and other valuable components worthless, or can require painstaking procedures to remove the bad chip from the assembly. Therefore, the chips and the mounting components used in any chip assembly system should permit testing of chips and replacement of defective chips before the chips are permanently fused to a substrate.

Thus, there is a need for methods of making microelectronic packages whereby one or more semiconductor chips may be temporarily connected to a substrate, microelectronic element or interposer for testing, before such chip is permanently attached to the substrate, microelectronic element and/or interposer.

SUMMARY OF THE INVENTION

In accordance with certain preferred embodiments of the present invention, a method of making a microelectronic assembly includes providing a first microelectronic element having one or more conductive bumps. The first microelectronic element may include a semiconductor chip, a semiconductor wafer, a semiconductor chip package having a dielectric element attached to a chip, a circuit board, a dielectric sheet, a circuit panel, a connection component, an interposer, a substrate and/or a dielectric substrate. The conductive bumps preferably include a first fusible material. The first fusible material preferably transforms from a solid to a liquid at a first melting temperature. In certain preferred embodiments, the first fusible material comprises one or more metals selected from the group consisting of tin and lead. In particularly preferred embodiments, the first fusible material may include a high lead solder having a lead content that is greater than or equal to 85% of the solder mass and a tin content that is less than or equal to 15% of the solder mass. In one particularly preferred embodiment, the high lead solder (e.g. solder material comprising greater than or equal to 85% lead and less than or equal to 15% tin) melts at approximately 320° C. In yet further preferred embodiments, the first fusible material includes high lead solder comprising approximately 90% lead and 10% tin. As is well know to those skilled in the art, the melt temperature of a high lead solder will increase as the percentage of lead in the solder increases. Thus, the melt temperature of the first fusible material may be modified by modifying the lead content of the solder.

The method also preferably includes providing a second microelectronic element having one or more conductive elements. The second microelectronic element may include a semiconductor chip, a semiconductor wafer, a semiconductor chip package having a dielectric element attached to a chip, a circuit board, a dielectric sheet, a circuit panel, a connection component, an interposer, a substrate and/or a dielectric substrate. The conductive elements of the second microelectronic element may include contact pads and/or leads. The conductive bumps of the first microelectronic element are preferably electrically interconnected with the conductive elements of the second microelectronic element using a second fusible material having a second melting temperature that is lower than the first melting temperature of the first fusible material. The first and second fusible materials may comprise any electrically conductive materials, or any combination of materials exhibiting electrically conductive properties, provided that such materials or combinations thereof result in the second fusible material having a melting point that is less than the melting point of the first fusible material. In certain preferred embodiments, the second fusible material comprises one or more metals selected from the group consisting of tin, lead, indium and bismuth. In particularly preferred embodiments, the second fusible material comprises a high tin solder comprising greater than or equal to 85% tin and less than of equal to 15% lead. In one highly preferred embodiment, the second fusible material comprises a bismuth/tin alloy having a melting temperature of approximately 37° C. In yet further preferred embodiments, the second fusible material includes high tin solder comprising approximately 90% tin and 10% lead. As is well know to those skilled in the art, the melt temperature of a high tin solder will increase as the percentage of tin in the solder increases. Thus, the melt temperature of the second fusible material may be modified by modifying the tin content of the solder. In still other preferred embodiments, the first fusible material or the second fusible material may include an anisotropic conductive polymer. In yet further preferred embodiments, either the first or the second fusible material may be non-conductive, however, the combination the first and second fusible materials is preferably conductive. During the electrically interconnecting step, the temperature of the second fusible material is maintained at a temperature that is greater than or equal to the second melting temperature and less than the first melting temperature of the first fusible material. In other words, during the electrically interconnecting step the first fusible material is in a liquid or molten state and the second fusible material is in a solid state.

After the first and second microelectronic elements are electrically interconnected, the second fusible material is preferably transformed back into a solid by lowering the temperature of the second fusible material to below the melting temperature thereof. The assembly may then be tested to insure that the first and second microelectronic elements are properly connected to one another and to ensure that both the first and second microelectronic elements are operating properly. If testing indicates that the assembly is operating properly, the first and second microelectronic elements may be permanently connected to one another by melting both the first and second fusible masses so that the fusible masses mix and/or interdiffuse. As is well known to those skilled in the art, the final product of the first and second fusible masses (i.e., the fusible mass resulting from the mixture of the first and second fusible masses) may have a new melting point that is difference from the original melting point of either the first fusible mass or the second fusible mass. Depending upon the exact composition of the first and second fusible materials, the melting temperature of the product may increase, decrease or remain the same. Once the first fusible material reaches its melting point, the first and second fusible materials will mix together to form conductive masses made up of both the first and second fusible materials. The temperature of the conductive masses may then be lowered to transform the conductive masses from a liquid to a solid.

In one particularly preferred embodiment, the first and second microelectronic elements are initially connected together when the temperature of the bismuth is greater than 37° C. but less than the melting temperature of the high lead solder (i.e. 320° C.). After the initial electrical connection is made, the temperature of the bismuth is reduced to below 37° C. to refreeze the bismuth. The assembly is then tested. If the test results are positive, the first and second microelectronic elements are permanently connected together by raising the temperature of both the high lead solder and the bismuth to above approximately 320° C. to melt both the high lead solder and the bismuth. After the bismuth, and the tin/lead of the high lead solder have mixed to form conductive masses comprising bismuth, tin and lead, the temperature of the conductive masses is lowered to below the melting point of the conductive masses to form a permanent mechanical and electrical interconnection between the first and second microelectronic elements.

In another preferred embodiment of the invention, a method of making a microelectronic assembly includes providing a first microelectronic element including one or more contacts, providing a second microelectronic element including one or more conductive pads and juxtaposing the first and second microelectronic elements with one another so that the one or more contacts face the one or more conductive pads. A releasable electrical interconnection is then preferably formed between the contacts of the first microelectronic element and the conductive pads of the second microelectronic element. The assembly is then tested while maintaining the releasable electrical interconnection between the first and second microelectronic elements. After testing, a permanent electrical interconnection in then formed between the first and second microelectronic elements.

In further preferred embodiments of the present invention, a microelectronic assembly includes a first microelectronic element having a contact bearing face and one or more contacts provided at the contact bearing face, and a second microelectronic element juxtaposed with the first microelectronic element, the second microelectronic element having a first surface including one or more conductive pads. The contacts of the first microelectronic element are electrically interconnected with the conductive pads of the second microelectronic element using one or more conductive masses. Each conductive mass preferably includes a first region comprising a first fusible material transformable from a solid to a liquid at a first melting temperature and a second region comprising a second fusible material transformable from a solid to a liquid at a second melting temperature that is less than the first melting temperature. The first fusible material may include tin, lead, a tin/lead composition or solder. The second fusible material may include indium, bismuth, or any other fusible, conductive material having a melting point less than the melting point of the first fusible material.

In certain preferred embodiments of the present invention, it may be possible to join together two microelectronic elements at a relatively low temperature, without requiring a second reflow operation to melt the first fusible masses of the first microelectronic element. Such a low temperature joining operation may take place where the first and second fusible materials are selected so that $T_{m2}<T_{m1}$ (where $T_{m1}$ is the melt temperature of the first fusible material and $T_{m2}$ is the melt temperature of the second fusible material), and so that the first and second materials interdiffuse into each other to yield an alloy with a melting temperature greater than the melting temperature of the second fusible material ($T_{mA}>T_{m2}$). For example, if the bumps comprise a first fusible material having a melt temperature of approximately 320° C., then a reflow temperature of approximately 320° C. is normally needed to form a joint with C4 bumps. However, if a tin/lead solder having a high tin content is used as the second fusible material, the first and second fusible masses may interdiffuse together to yield an alloy with a melt temperature that is greater than the melt temperature of the second fusible material ($T_{mA}>T_{m2}$). Thus, it is possible to form a permanent and reliable joint without reflowing the first fusible material. Such a conductive joint can operate at temperatures above the melting temperature of the first fusible material ($T_{m1}$) of tin/lead solder.

BRIEF DESCRIPTION OF THE DRAWINGS

FIGS. 5A–5B show a method of attaching a semiconductor wafer to a second microelectronic element including a low melting temperature conductive material and simultaneously displacing a plurality of flexible leads, in accordance with another preferred embodiment of the present invention.

DETAILED DESCRIPTION OF PREFERRED EMBODIMENTS

Figure 1A:
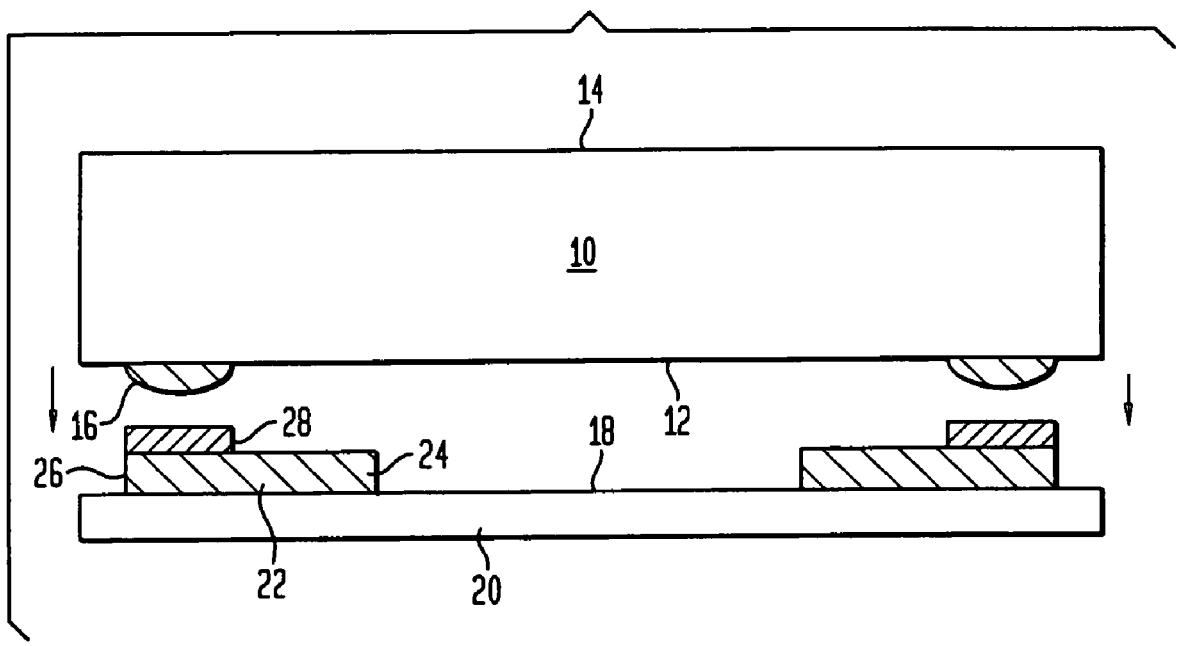
FIG. 1A shows a first step of a method of attaching a first microelectronic element to a second microelectronic element having a low melting temperature conductive material, in accordance with certain preferred embodiments of the present invention.

Referring to FIG. 1A, a semiconductor chip 10 includes a contact bearing surface 12 and back surface 14. The contact bearing surface 12 includes conductive bumps 16 preferably made of a conductive material such as tin. The semiconductor chip 10 is juxtaposed with a top surface 18 of a substrate 20. The substrate 20 includes traces or leads 22 having first ends 24 permanently attached to substrate 20 and second ends 26 releasably attached to the first surface 18 of the substrate 20. The leads 22 may be flexible. The leads may also be peelable or releasable leads as disclosed in certain preferred embodiments of commonly assigned U.S. patent application Ser. Nos. 09/200,100; 09/020,750; 09/195,371; and 09/225,669 and U.S. Pat. No. 5,763,941, the disclosures of which are hereby incorporated by reference herein. The leads may include frangible sections as disclosed in certain preferred embodiments of U.S. Pat. Nos. 5,629,239; 5,821,609; and 5,915,752, the disclosures of which are hereby incorporated by reference herein. The second ends 26 of the leads 22 have pads of a low melt material 28, such as bismuth or indium. The low melt material 28 is preferably electrically conductive and has a melting point that is lower than the melting point of the bumps 16. In other embodiments the low melt material 28 may include a low melting temperature conductive polymer or aluminum.

Figure 1B:
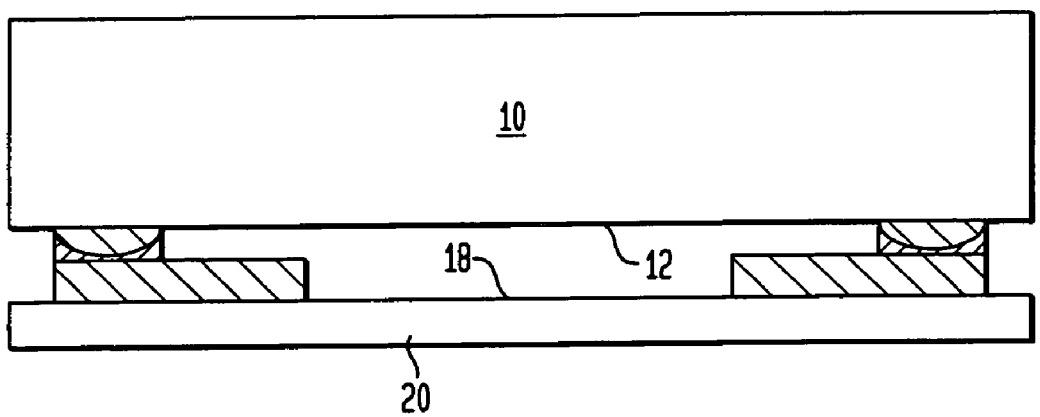
FIGS. 1B–1D show further steps of a method of assembling the first and second microelectronic elements shown in FIG. 1A.

Referring to FIG. 1B, the contact bearing face 12 of chip 10 is juxtaposed with the top surface 18 of substrate 20 so that the bumps 16 are in substantial alignment with the low melt material pads 28. The bumps 16 are then abutted against the low melt material pads 28. This step is preferably done at a temperature at which the low melt material is in a liquid state. As mentioned above, in one particular preferred embodiment, the low melt material 28 comprises bismuth. The melting point of the bismuth pads 28 is lower than the melting point of the bumps 16. As a result, the chip 10 may be temporarily connected to the substrate 20 by reflowing the bismuth pads 28. After the chip 10 has been electrically interconnected with the substrate 20, the chip 10 may be tested while remaining temporarily attached to the substrate 20. If testing shows that the chip 10 is defective, the chip may be detached from the substrate by elevating the temperature of the bismuth pads 28 to a temperature above the melting temperature of bismuth but below the melting temperature of bumps 16. As a result, the defective chip may be easily removed from the substrate 20 without destroying either the chip 10 or the substrate 20. In other embodiments, the chip 10 may operate properly, however, the substrate may be defective. The present invention also enables one to remove operational chips from a defective substrate 20.

Figure 1C:
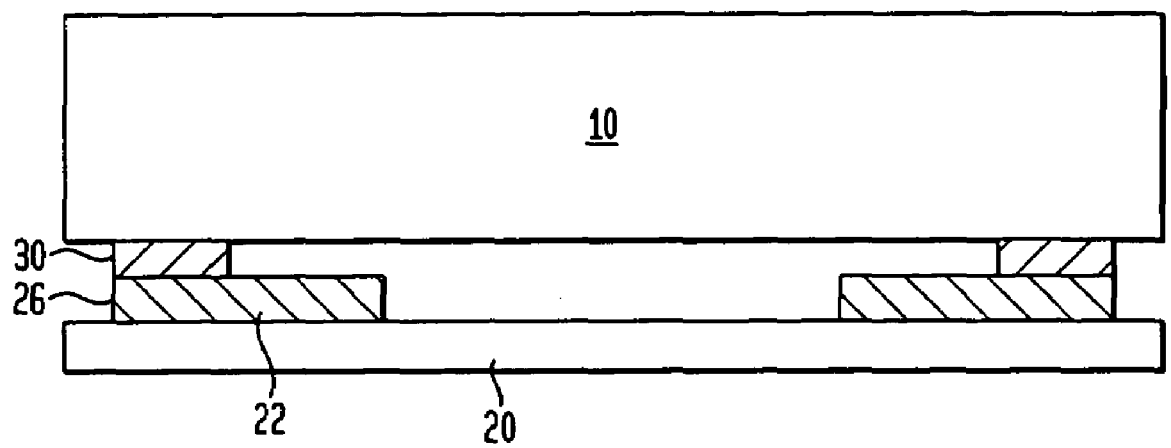

After the chip 10 and/or the substrate 20 have been completely tested and found to be operational, it may be desirable to permanently attach the chip 10 to the substrate 20. Referring to FIG. 1C, this is preferably accomplished by performing a second reflow operation whereby the bumps 16 are reflowed. In one preferred embodiment, the bumps comprise a tin/lead mixture having a melting temperature (Tm2) that is higher than the melt temperature (Tm1) of the bismuth. Once the bump material reflows, it will mix with the bismuth pad 28 to form a permanent electrical and mechanical interconnection between the semiconductor chip 10 and the substrate 20. The resultant conductive masses 30 are preferably permanently connected to the semiconductor chip and the second ends 26 of leads 22.

Figure 1D:
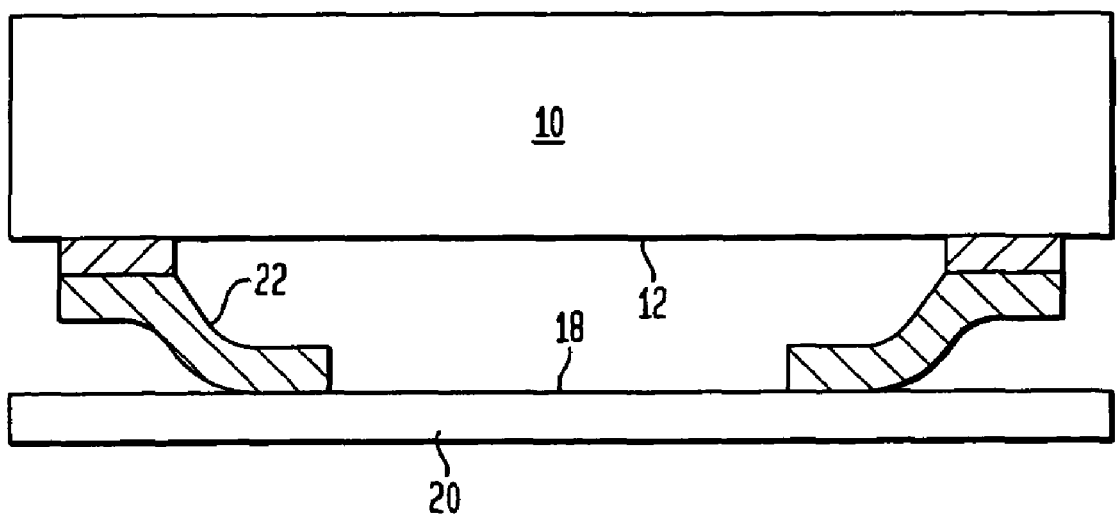

Referring to FIG. 1D, the chip 10 and the substrate 20 are moved away from one another in a controlled fashion, such as by using platens (not shown) so as to deform leads 22 into substantially "S" shaped leads that may flex and move during thermal cycling. The chip and substrate may also be moved away from one another by injecting a curable liquid encapsulant between the front face 12 of the semiconductor chip 10 and the top surface 18 of the substrate 20 as disclosed in certain preferred embodiments of commonly assigned U.S. Pat. Nos. 5,518,964; 5,798,286 and 5,976,913, the disclosures of which are hereby incorporated by reference herein. As the curable liquid encapsulant flows between the chip and the substrate, the chip and substrate are urged to move apart from one another by the encapsulant.

Figure 2A:
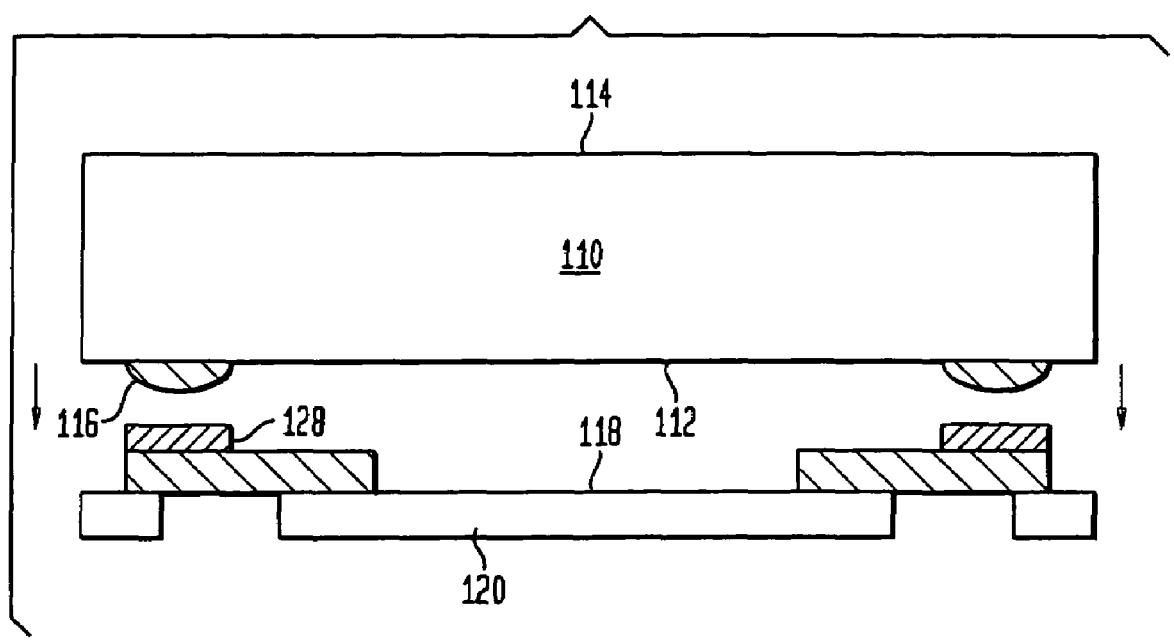
FIG. 2A shows a method of attaching a first microelectronic element to a second microelectronic element including a low melting temperature conductive material, in accordance with further preferred embodiments of the present invention.
Figure 2B:
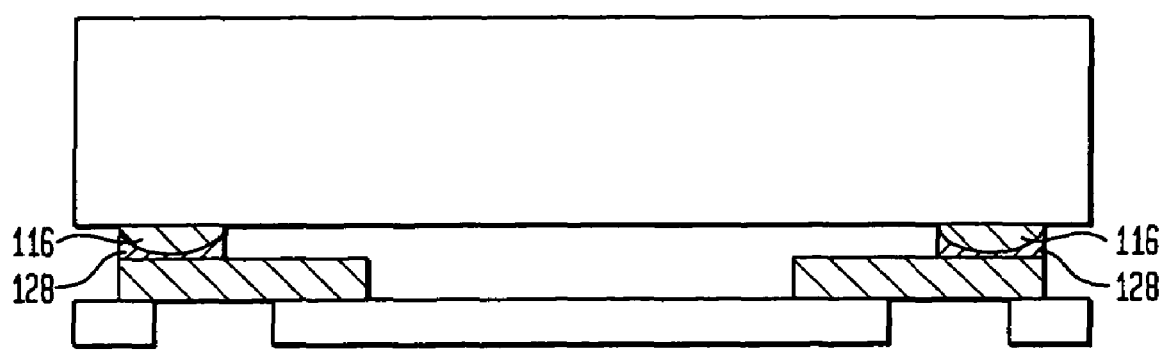
FIGS. 2B–2D show further steps of a method of assembling the first and second microelectronic elements of FIG. 2A.

FIGS. 2A–2D show another method for temporarily attaching a microelectronic element to a substrate for testing, in accordance with further preferred embodiments of the present invention. As mentioned above, the temporary attachment enables one to test a semiconductor chip and/or another microelectronic element before the chip and/or element is permanently attached to another microelectronic element or substrate. Referring to FIG. 2A, semiconductor chip 110 having contact bearing face 112 and rear surface 114 is juxtaposed with substrate 120 having top surface 118. The semiconductor chip 110 includes one or more conductive bumps 116 preferably made of a first fusible material such as lead/tin solder. The conductive bumps 116 are placed in substantial alignment with pads of a second fusible material having a melting temperature that is below the melting temperature of the first fusible material, such as bismuth or indium. Referring to FIG. 2A, before the bumps 116 abut against the second fusible material, the pads of the second fusible material 128 are preferably raised to a temperature sufficient to place the second fusible material in a liquid state. As a result, the conductive bumps 116 of the first fusible material sink into the second fusible material of a low melt metal 128 when the bumps 116 abut against the low melt metal pads 128.

Figure 2C:
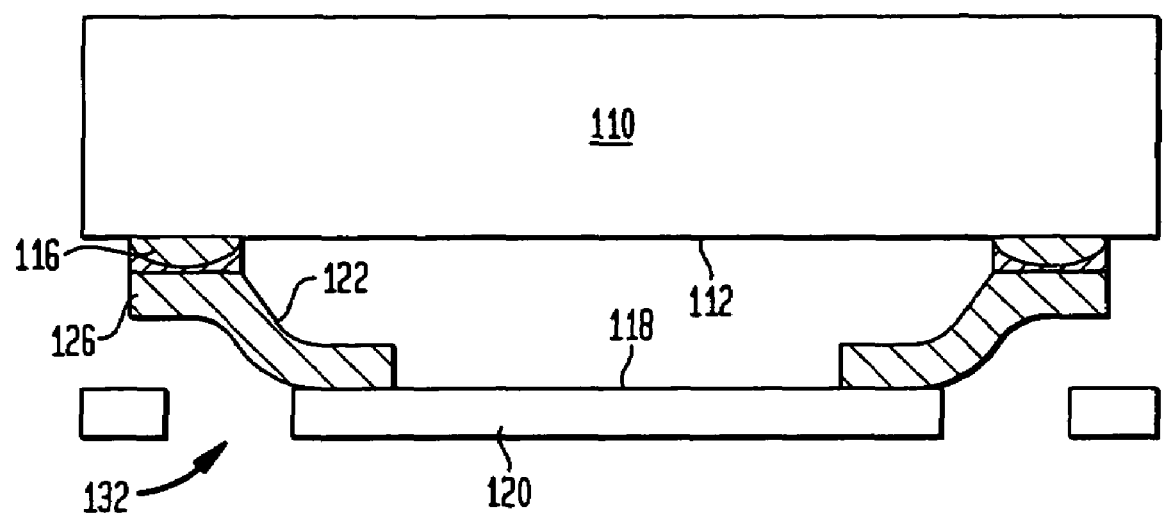
Figure 2D:
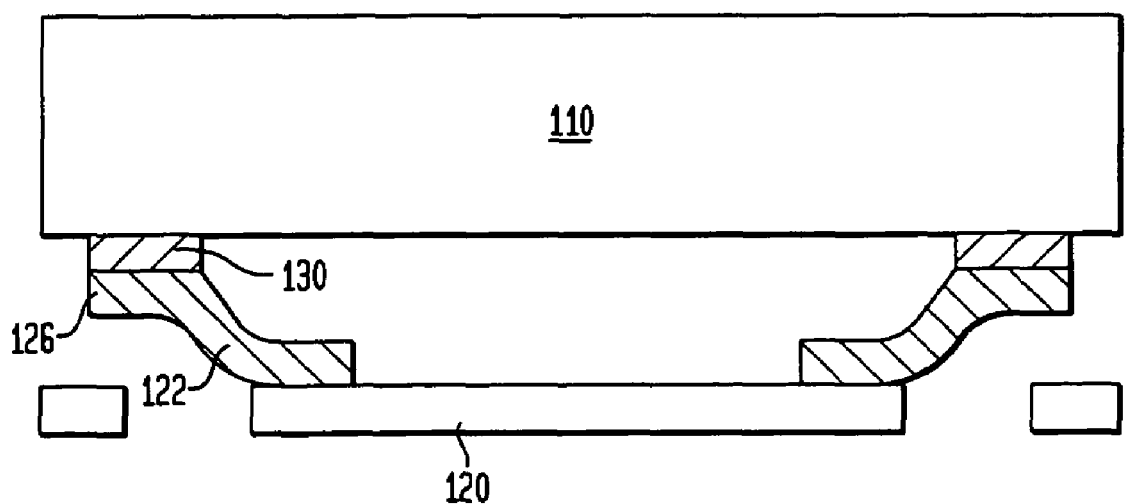

Referring to FIG. 2C, the temperature of the second fusible material 128 is then reduced to below the melting point of the second fusible material to refreeze the pads, thereby temporarily attaching the chip 110 to the substrate 120. Once the chip 110 is temporarily attached to the substrate 120, the chip and substrate are moved away from one another so as to deform leads 122. In certain preferred embodiments, the chip may have an area array of contacts that are simultaneously connected with the tip ends of a plurality of leads, as disclosed in certain preferred embodiments of commonly assigned U.S. Pat. No. 5,518,964, the disclosure of which is hereby incorporated by reference herein. After the contacts are connected to the tip ends of the leads, all of the leads may be deformed simultaneously. Before the leads are deformed, the leads may curve within a plane as disclosed in certain preferred embodiments of commonly assigned U.S. Pat. No. 5,830,783, the disclosure of which is hereby incorporated herein by reference. Once the leads have been deformed, the package is tested. If testing shows that the package is fully operational, the temperature of the bumps 116 of first fusible material is then elevated to a temperature that is above the melting point of the first fusible material. In certain preferred embodiments, the bumps comprise a lead/tin combination (e.g. 85% lead/ 15% tin) so that the bumps melt between approximately 200–340° C. Once the bumps of first fusible material melt, the lead/tin material and the bismuth material mix together to form conductive masses interconnecting the chip 110 and the substrate 120. The temperature of the conductive masses 130 is then reduced to below the freezing point of the conductive masses. Once the conductive masses refreeze, the chip and the substrate are permanently connected together. In other preferred embodiments, one or more resilient nubbins (not shown) may be provided between the contact bearing face 112 of the semiconductor chip 110 and the top surface 118 of substrate 120, as disclosed in commonly assigned U.S. Pat. No. 5,659,952, the disclosure of which is hereby incorporated by reference herein. A bond tool may then be used to engage the second ends 126 of the leads 122 through bond windows 132 to vertically extend leads 122.

Figure 3A:
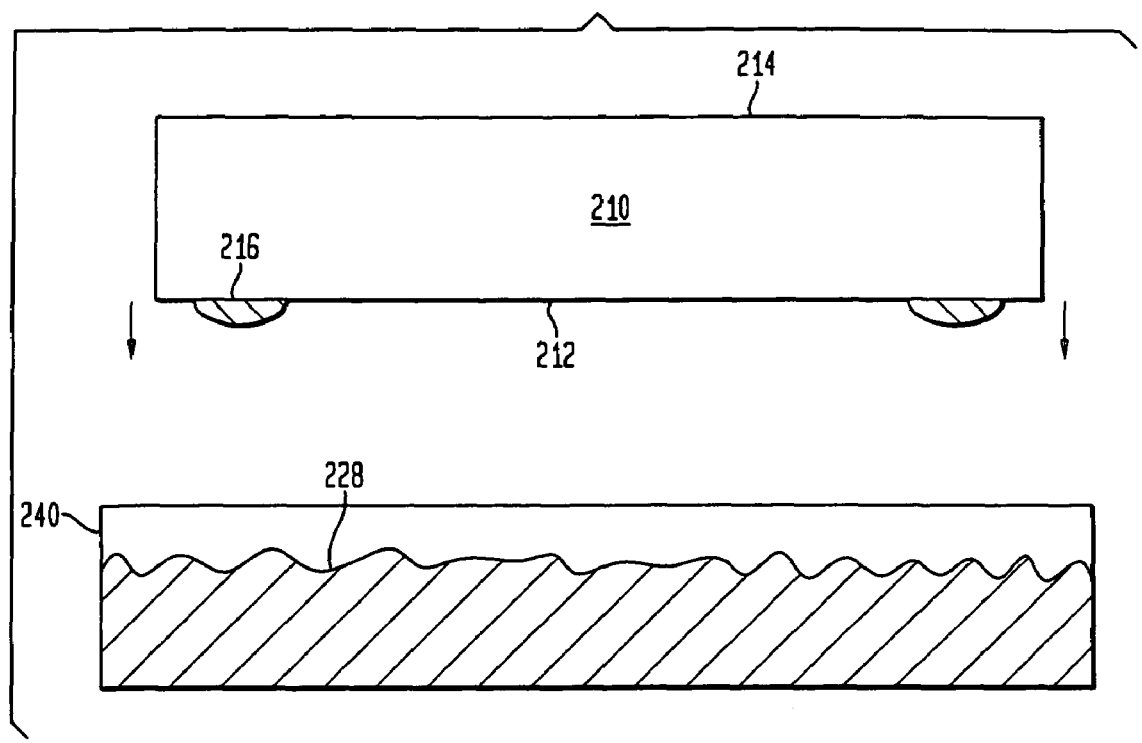
FIG. 3A shows a method of attaching a first microelectronic element to a second microelectronic element including a low melting temperature conductive material, in accordance with further preferred embodiments of the present invention.

FIGS. 3A–3F show another method of temporarily attaching a first and second microelectronic element together, in accordance with still further preferred embodiments of the present invention. Referring to FIG. 3A, a first microelectronic element, such as for example a semiconductor chip 210 has a front contact bearing face 212 and a rear surface 214 remote therefrom. The front face 212 of the semiconductor chip 210 includes a plurality of conductive bumps 216. The contact bearing face 212 of chip 210 is placed over a tray 240 containing a low melting temperature conductive material 228 such as indium or bismuth. The low melting temperature conductive material 228 is preferably stored in the tray at a temperature that is above the melting point of the indium or bismuth.

Figure 3B:
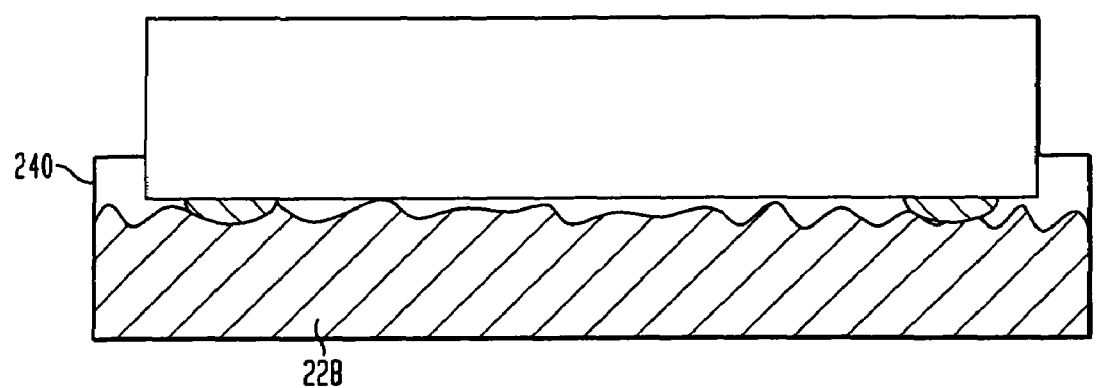
FIGS. 3B–3F show further steps of a method of assembling the first and second microelectronic elements of FIG. 3A.

Referring to FIG. 3B, the conductive bumps 216 are at least partially immersed in the low melting temperature conductive material 228. After the bumps have been coated with the low melt material 228, the chip 210 is removed from the tray 240. In other preferred embodiments, a solder paste may be screen-printed onto a plate and a semiconductor chip or semiconductor wafer having bumped contacts may be juxtaposed with the plate. The bumped contacts may then be dipped into the screen-printed solder paste to apply the second fusible material to the bumps.

Figure 3C:
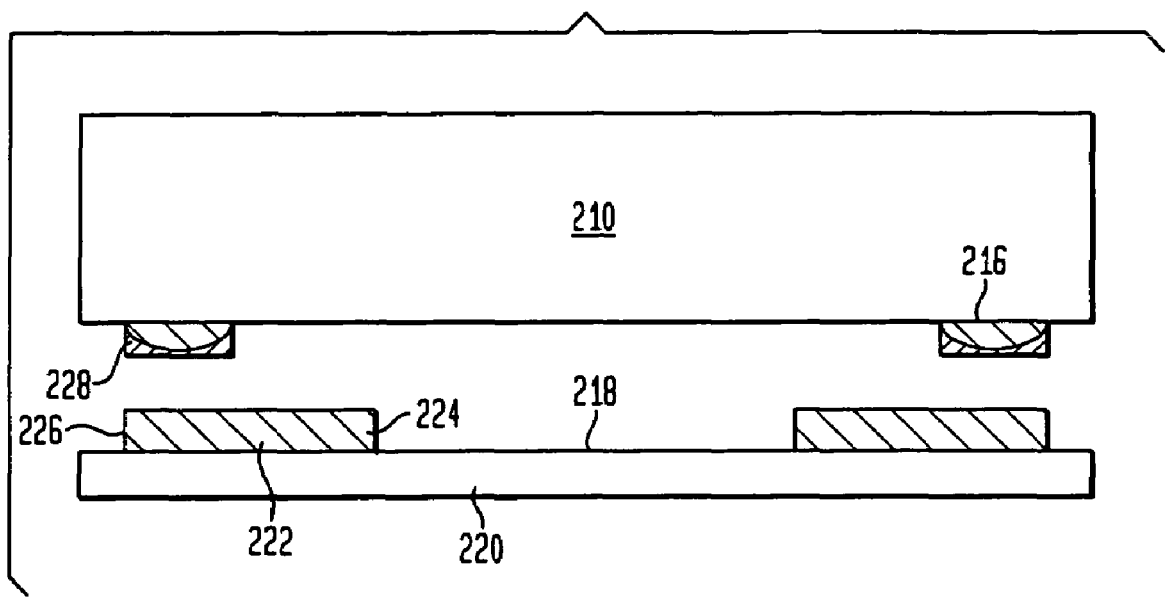

Referring to FIG. 3C, the semiconductor chip 210 is then juxtaposed with a substrate 220 such as a printed circuit board. The substrate 220 includes a top surface 218 having leads 222 with first ends 224 permanently attached to the top surface of 218 of substrate 220 and second ends 226 that are releasably attached to the top surface 218 of substrate of 220.

Figure 3D:
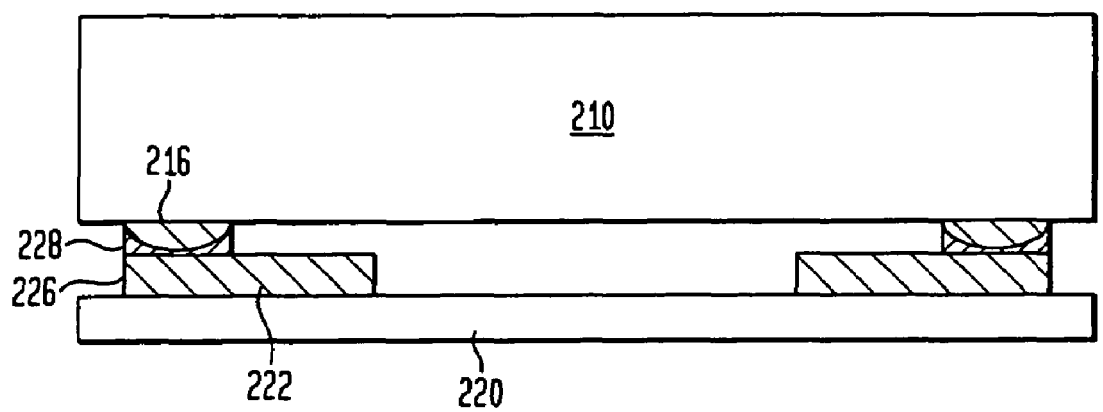

Referring to FIG. 3D, the semiconductor chip 210 is then abutted against the substrate 220 so that the layer of low melting temperature conductive material 228 contacts the second ends 226 of flexible leads 222. The low melting temperature conductive material 228 and the bumps 216 electrically interconnect the semiconductor chip 210 with the substrate 220. As a result, the subassembly of FIG. 3D may be tested while the semiconductor chip is temporarily attached to the substrate. The low melting temperature conductive material is preferably reduced to a temperature that is below the melting point of the low melting temperature conductive material. If testing shows that the subassembly is fully operational and that there are no defects of the semiconductor chip 10 or substrate 220, the elements may be permanently attached to one another.

Figure 3E:
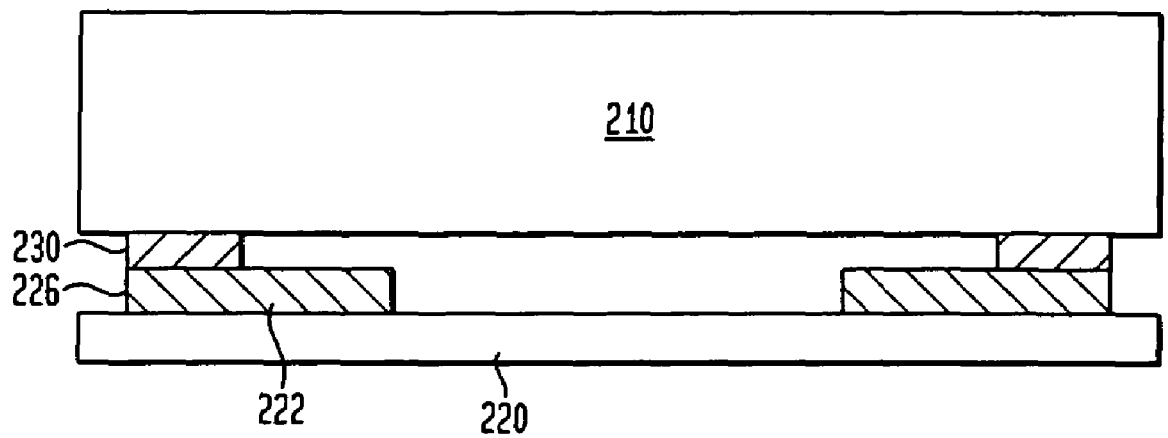
Figure 3F:
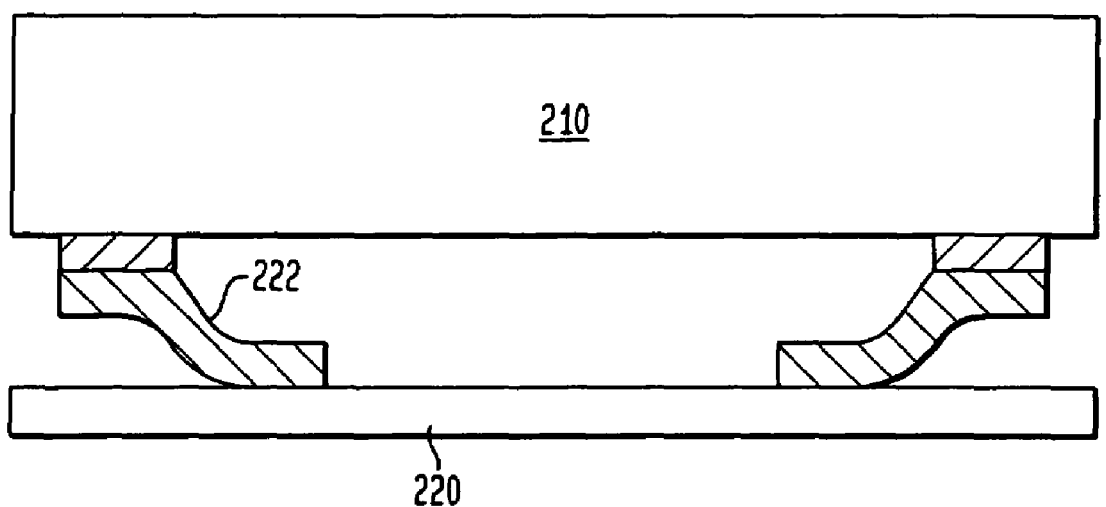

Referring to FIG. 3E, the semiconductor chip 210 is permanently attached to substrate 220 by raising the temperature of the conductive bumps 216 to above the melting point of the conductive bump material. For example, in one preferred embodiment the conductive bumps are made of a tin/lead alloy and the temperature of the conductive bumps is raised to greater than 320° C. for reflowing the conductive bumps. Once the conductive bumps are reflowed, the bump material mixes with the low melting point conductive material to form conductive masses 230. The conductive masses 230 are then refrozen (i.e., reduced to a temperature below the melting point) to permanently attach the contacts of semiconductor chip 210 and the second ends 226 of flexible leads 222, and create an electrical interconnection between the chip and substrate. Referring to FIG. 3F, the chip 210 and substrate 220 may then be moved away from one another in a controlled fashion so as to deform leads 222 into flexible leads such as the substantially S shaped leads shown. The flexible leads 222 enable the chip 210 and substrate 220 to move relative to one another during operation of the assembly. The chip and substrate may be moved away from one another using platens (not shown) or by injecting a curable liquid encapsulant between the chip and the substrate for forcing the chip and the substrate away from one another. The encapsulant may then be cured to provide a resilient layer between the chip and the substrate.

Figure 4A:
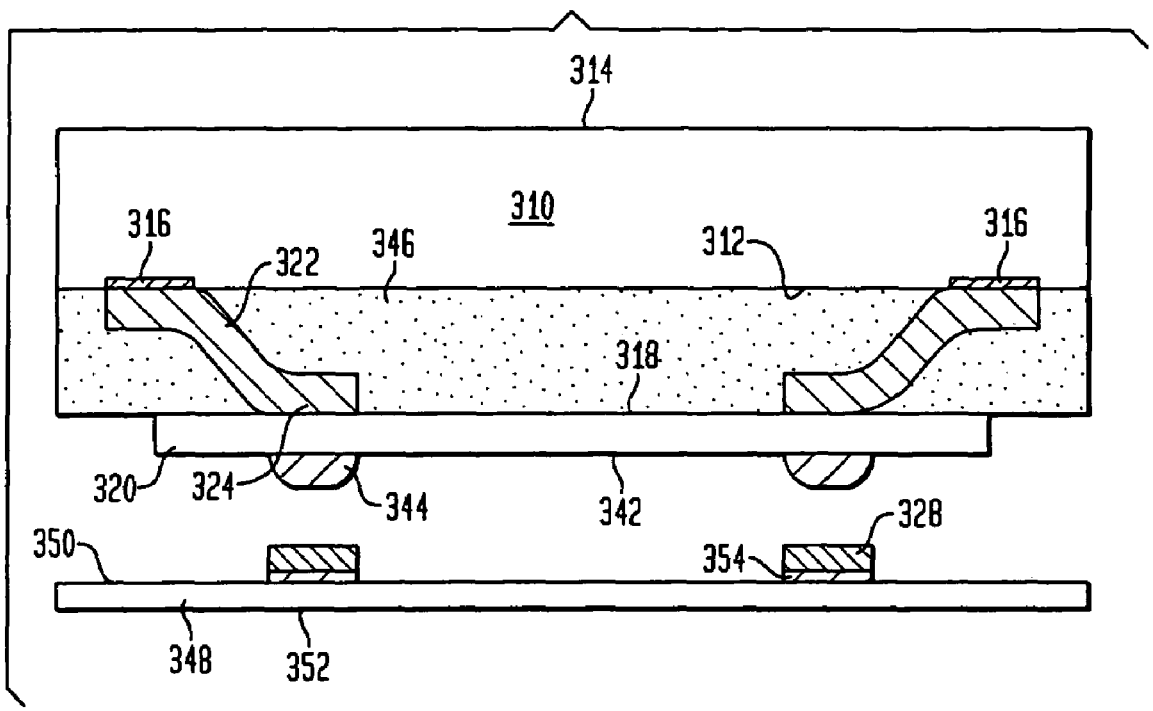
FIGS. 4A–4C show a method of attaching a first microelectronic element to a second microelectronic element including a low melting temperature conductive material, in accordance with still further preferred embodiments of the present invention.

FIG. 4A shows semiconductor chip package including semiconductor chip 310 having a contact bearing surface 312 and a back surface 314. The contact bearing surface 312 with a chip 310 includes contacts 316. The semiconductor chip 310 is electrically interconnected with a preferably dielectric sheet 320 having leads 322 attached thereto. Each lead 322 has a first end 324 permanently attached to the dielectric sheet 320 and a second tip end 326 remote therefrom. The second tip end 326 of each lead 322 is bonded to one of the contacts 316. The package includes bumps 344 exposed on the underside 342 of the flexible dielectric sheet 320. Such conductive bumps 344 preferably made of a conductive material such as tin, lead or a tin/lead alloy. The semiconductor chip package includes a compliant layer 346 preferably made of a curable dielectric encapsulant dispose between the contact bearing face 312 of the semiconductor chip 310 and a top surface 318 of flexible dielectric sheet 320. The compliant layer 346 facilitates relative movement between the conductive bumps 344 and chip contacts 316 during thermal cycling, thereby enhancing the reliability of the semiconductor chip package.

The conductive bumps 344 projecting from the bottom surface 342 of the flexible dielectric sheet 320 enable the semiconductor chip package to be electrically interconnected with an external element. In one preferred embodiment, the external element is a printed circuit board 348 including a top surface 350 and a bottom surface 352 remote therefrom. The top surface of the printed circuit board 348 includes contacts 354 having pads of a low melting point material 328 provided thereon. As described above, the pads of low melting point material 328 have a melting point that is less than the melting point of the material comprising conductive bumps 344. The low melting temperature material is preferably conductive.

Figure 4B:
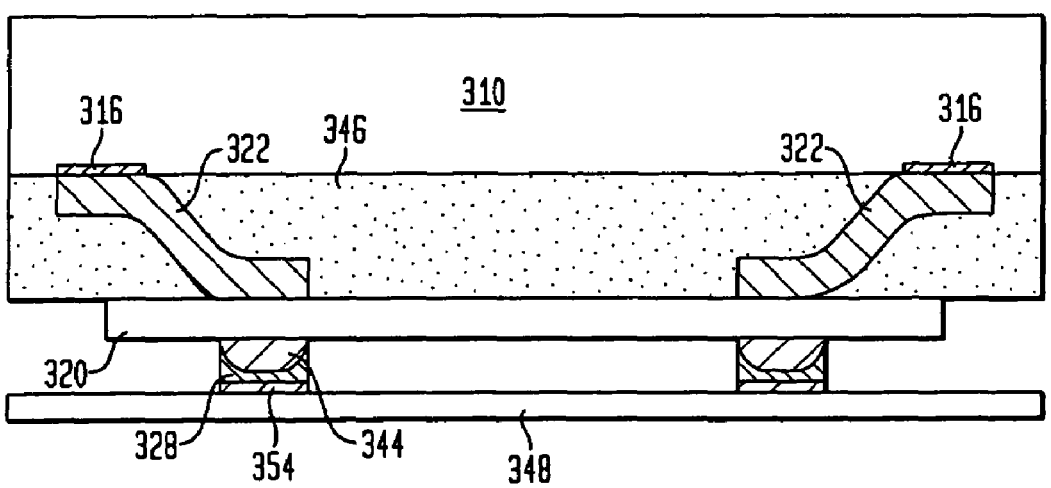

Referring to FIG. 4B, the pads of low melting point material 328 are heated and/or maintained at a sufficient temperature to reflow the pads 328. For example, in preferred embodiments the pads of low melt material 328 comprise bismuth having a melting point at approximately 32–42° C. Thus, the bismuth pads 328 must be maintained at or above the melting point temperature during this process step. The semiconductor chip package is abutted against the circuitized substrate 348 so that the conductive bumps 344 engage and sink into the bismuth pads 328 provided in a liquid state. The temperature of the bismuth pads 328 is then lowered to below the melting point of bismuth to refreeze the bismuth. The refrozen bismuth pads 328 create a temporary mechanical and electrical interconnection between the semiconductor chip package and the circuitized substrate 348. The assembly of FIG. 4B is then tested to ensure that all of the components of the assembly are operating properly.

Figure 4C:
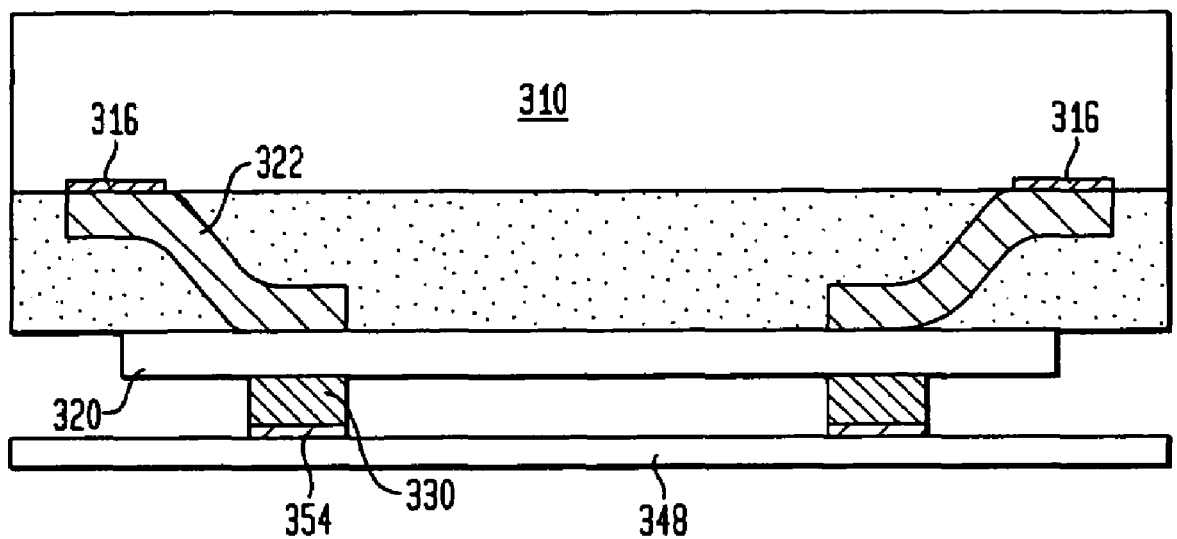

Referring to FIG. 4C, if testing indicates that the assembly is fully functional, the semiconductor chip package is permanently connected to the circuitized substrate 348. In one preferred embodiment, this is accomplished by elevating the temperature of the conductive bumps 344 (FIG. 4B) to a temperature that is above the melting point of the material comprising the conductive bumps 344. In one preferred embodiment, the conductive bumps 344 are preferably C4 bumps comprising a tin/lead composition having a melting and/or reflow temperature of approximately 320° C. Thus, in this embodiment, the conductive bumps 344 are elevated to a temperature at or above 320° C. for reflowing the conductive bumps. Once the conductive bumps are reflowed, the molten tin/lead material mixes with the bismuth material to form conductive masses 330 that electrically and mechanically interconnect the semiconductor chip package and the circuitized substrate 348.

In further embodiments, the pads of low melt material may not be provided atop the contacts 354 of the circuitized substrate 348. In these embodiments, the conductive bumps 344 of the semiconductor chip package are dipped in a tank including reflowed bismuth to form a layer of bismuth atop the conductive bumps 344. Once the layer of a bismuth has been applied, the conductive bumps may be abutted against the contacts 354 of the circuitized substrate 348 to form a temporary attachment between the semiconductor chip package and the circuitized substrate. If testing shows that the assembly is fully functional, the semiconductor chip package may then be permanently connected to the substrate by reflowing the conductive bumps of the semiconductor chip package.

Referring to FIG. 5A, a semiconductor wafer 410 includes a plurality of individual semiconductor chips having conductive bumps 416 preferably made of a conductive material, such as tin. The semiconductor wafer 410 is desirably juxtaposed with a second microelectronic element 420, such as a flexible dielectric substrate. The second microelectronic element 420 includes leads 422 having first ends 424 permanently attached to second microelectronic element 420 and second ends 426 releasably attached to a first surface 418 of second microelectronic element 420. The leads 422 may be flexible and may also be peelable or releasable as disclosed in certain preferred embodiments of commonly assigned U.S. Pat. No. 5,763,941, the disclosure of which is hereby incorporated by reference herein. The second ends 426 of the leads 422 have pads 428 of a low melt material, such as bismuth or indium. The low melt material is preferably electrically conductive and has a melting point that is lower than the melting point of conductive bumps 416. In other preferred embodiments, the low melt material may include a low melting temperature conductive polymer or aluminum.

The contact bearing face 412 of semiconductor wafer 410 is desirably juxtaposed with top surface 418 of second microelectronic element 420 so that the conductive bumps 416 are in substantial alignment with the pads 428 of low melt material. The conductive bumps 416 are then abutted against the pads of low melt material 428. This step is preferably accomplished at a temperature at which the low melt material pads 428 are in a liquid state. As a result, the semiconductor wafer may be temporarily connected to the second microelectronic element 420 by reflowing the low melt material pads 428. After the semiconductor wafer 410 has been electrically interconnected with the second microelectronic element 420, wafer 410 and/or the package assembled therewith may be tested while remaining temporarily attached to second microelectronic element 420. Before the testing begins, the temperature of the low melt material pads 428 may be reduced below the melting temperature thereof for returning the liquefied pads back to a solid state. If testing shows that the semiconductor wafer 410 is defective or a poor electrical interconnection has been established, the wafer 410 may be detached from its engagement with the second microelectronic element 420 by elevating the temperature of the low melt material pads 428 to a temperature that is above the melting temperature of the pad material but below the melting temperature of the material comprising the conductive bumps 416. As a result, defective wafers 410 may be easily removed from attachment to second microelectronic element 420 without destroying either the wafer 410 or the second microelectronic element 420. The present invention also enables the removal of fully operational wafers 410 from attachment to defective second microelectronic elements 420.

Referring to FIGS. 5A and 5B, after the assembly has been tested and found operational, a second reflow operation may be performed whereby conductive bumps 416 are reflowed into a liquid state. Once the conductive bump material reflows, it will mix the low melt material of the pads 428 to form a permanent electrical and mechanical interconnection between wafer 410 and second microelectronic element 420. The resultant conductive masses 430 are preferably permanently connected to contacts (not shown) of wafer 410 and the second ends 426 of leads 422.

Referring to FIG. 5B, semiconductor wafer 410 and second microelectronic element 420 are moved away from one another in a controlled fashion, such as by using platens (not shown) so as to deform leads 422 into a substantially S-shaped form, whereby leads 422 may flex, bend and/or move during thermal cycling of the package. The semiconductor wafer 410 and second microelectronic element 420 may also be moved away from one another by introducing a curable liquid encapsulant between the front face 412 of wafer 410 and top surface 418 of second microelectronic element 420 as disclosed in certain preferred embodiments of commonly assigned U.S. Pat. No. 5,518,964, the disclosure of which is hereby incorporated by reference herein. As the curable liquid encapsulant flows between wafer 410 and second microelectronic element 420, the wafer and microelectronic element are urged to move apart from one another by the encapsulant material. The curable liquid encapsulant material is preferably cured to provide a compliant layer surrounding leads 422 and extending between wafer 410 and second microelectronic element 420. The assembly shown in FIG. 5B may be severed, such as by cutting through wafer 410, compliant layer 446 and second microelectronic element 420 along the axis designated C—C for providing individual packages comprising one or more semiconductor chips electrically interconnected with a region of second microelectronic element 420. One or more terminals 470 may be formed in second microelectronic element 420. Terminal 470 includes a metal lined via electrically interconnected with the fixed or first end 424 of lead 422. A fusible conductive mass 472, such as solder, may be provided in the metal lined via of terminal 470 for facilitating electrical interconnection of terminal 470 to a contact of another microelectronic element, such as a printed circuit board.

Although the present invention has been described with reference to particular preferred embodiments, it is to be understood that the embodiments are merely illustrative of the principles and application of the present invention. It is therefore understood that numerous modifications may be made to the preferred embodiments of the present invention without departing from the spirit and scope of the present invention as defined by the claims.

The invention claimed is:

1. A microelectronic assembly comprising:
    a first microelectronic element having a contact bearing face and at least one contact accessible at the contact bearing face;
    a second microelectronic element opposing said first microelectronic element, said second microelectronic element having a first surface including at least one lead extending over the first surface;
    a first fusible material engaging the at least one contact of said first microelectronic element;
    a second fusible material engaging the at least one lead, wherein one of said first and second fusible materials has a higher melting temperature and one of said first and second fusible materials has a lower melting temperature;
    said first and second microelectronic elements being juxtaposed with one another so that said first and second fusible materials are in substantial alignment with one another, wherein one of said first and second fusible materials is in a liquid state and one of said first and second fusible materials is in a solid state, wherein said first microelectronic element includes a semiconductor wafer comprising a plurality of semiconductor chips, said wafer being severable for providing individual packages comprising one or more of said semiconductor chips electrically interconnected with at least a region of said second microelectronic element.

2. The microelectronic assembly as claimed in claim 1, wherein said first microelectronic element is selected from the group consisting of a semiconductor chip, a semiconductor wafer, a semiconductor chip package chip, a circuit board, a dielectric sheet, a circuit panel, a connection component, an interposer, a substrate and a dielectric substrate.

3. The microelectronic assembly as claimed in claim 1, wherein said second microelectronic assembly is selected from the group consisting of a semiconductor chip, a semiconductor wafer, a semiconductor chip package, a circuit board, a dielectric sheet, a circuit panel, a connection component, an interposer, a substrate and a dielectric substrate.

4. The microelectronic assembly as claimed in claim 1, wherein said at least one lead comprises an array of flexible leads extending between and electrically interconnecting said first and second microelectronic elements.

5. The microelectronic assembly as claimed in claim 1, wherein said first and second fusible materials are spaced from one another.

6. The microelectronic assembly as claimed in claim 1, wherein said first and second fusible materials are conductive.

7. The microelectronic assembly as claimed in claim 1, wherein said first and second fusible materials are connectable together for electrically interconnecting said first and second microelectronic elements.

8. The microelectronic assembly as claimed in claim 1, wherein the at least one lead has a first end permanently attached to said second microelectronic element and a second end releasably attached to said second microelectronic element.

9. The microelectronic assembly as claimed in claim 1, wherein the at least one lead overlies the first surface of said second microelectronic element.

10. The microelectronic assembly as claimed in claim 1, wherein the at least one lead is flexible.

11. A microelectronic assembly comprising:
    a first microelectronic element having a contact bearing face and one or more contacts provided at the contact bearing face;
    a second microelectronic element juxtaposed with said first microelectronic element, said second microelectronic element having a first surface including one or more conductive pads;
    one or more conductive masses electrically interconnecting the contacts of said first microelectronic element and the conductive pads of said second microelectronic element, wherein each said conductive mass includes a first region comprising a first fusible material transformable from a solid to a liquid at a first melting temperature and a second region comprising a second fusible material transformable from a solid to a liquid at a second melting temperature that is less than the first melting temperature; and
    at least one flexible lead extending between and electrically interconnecting said first and second microelectronic elements, wherein said first microelectronic element includes a semiconductor wafer comprising a plurality of semiconductor chips, said wafer being severable for providing individual packages comprising one or more of said semiconductor chips electrically interconnected with at least a region of said second microelectronic element.

* * * * *

UNITED STATES PATENT AND TRADEMARK OFFICE
CERTIFICATE OF CORRECTION

PATENT NO. : 7,205,659 B2 Page 1 of 1
APPLICATION NO. : 10/777804
DATED : April 17, 2007
INVENTOR(S) : Masud Beroz and David Light It is certified that error appears in the above-identified patent and that said Letters Patent is hereby corrected as shown below:

Column 13, line 45, "chip package chip, a" should read -- chip package, a --.

Signed and Sealed this

Twenty Second Day of April, 2008

JON W. DUDAS
*Director of the United States Patent and Trademark Office*